United States Patent [19]

Gubitose et al.

[11] 4,106,532
[45] Aug. 15, 1978

[54] MACHINE FOR STRAIGHTENING THE WIRE LEADS OF A DEVICE

[75] Inventors: Nicholas Francis Gubitose, Moosic; Robert Arthur James, Hunlock Creek, both of Pa.

[73] Assignee: RCA Corporation, New York, N.Y.

[21] Appl. No.: 804,006

[22] Filed: Jun. 6, 1977

[51] Int. Cl.² .............................................. B21F 1/02
[52] U.S. Cl. .................................................. 140/147
[58] Field of Search ........................... 140/147, 105; 72/DIG. 10

[56] References Cited

U.S. PATENT DOCUMENTS

| 3,144,889 | 8/1964 | Cole | 140/147 |
| 3,520,336 | 7/1970 | Zemek | 140/147 |
| 3,525,372 | 8/1970 | Haven | 140/147 |

*Primary Examiner*—Lowell A. Larson
*Attorney, Agent, or Firm*—H. Christoffersen; R. A. Hays

[57] ABSTRACT

A machine for straightening a wire lead or leads of a device comprises first and second opposing jaws affixed to a base. The first jaw and second jaw, when meshed, exert lateral straightening forces on the leads, and a slot disposed near the base of the leads is provided to prevent the fracture of the leads during the straightening operation and this slot also aligns the leads when there are more than one.

10 Claims, 5 Drawing Figures

MACHINE FOR STRAIGHTENING THE WIRE LEADS OF A DEVICE

The present invention relates generally to a machine for straightening the leads of a device such as a transistor or other semiconductor device.

The straightening of the leads of a semiconductor device during the manufacture thereof is presently a very time consuming and occasionally destructive procedure. This is especially true if the leads to be straightened are semi-rigid and have a glass to metal seal where they enter the device, for example, like those utilized in semiconductor power transistors. The reason for these problems is that the leads almost always need to be manually pre-straightened in order to position them into present straightening jigs. In such a manual operation, extreme care must be taken to avoid fracturing the lead and/or the glass to metal seal. Thus, because the pre-straightening must be performed manually and carefully, it is occasionally destructive and very time consuming.

A machine utilizing the principles of the present invention is capable of straightening wire leads with a minimum of manual assistance. Further, such a machine reduces the possibility of fracturing the lead and/or its seal.

Figure 1:
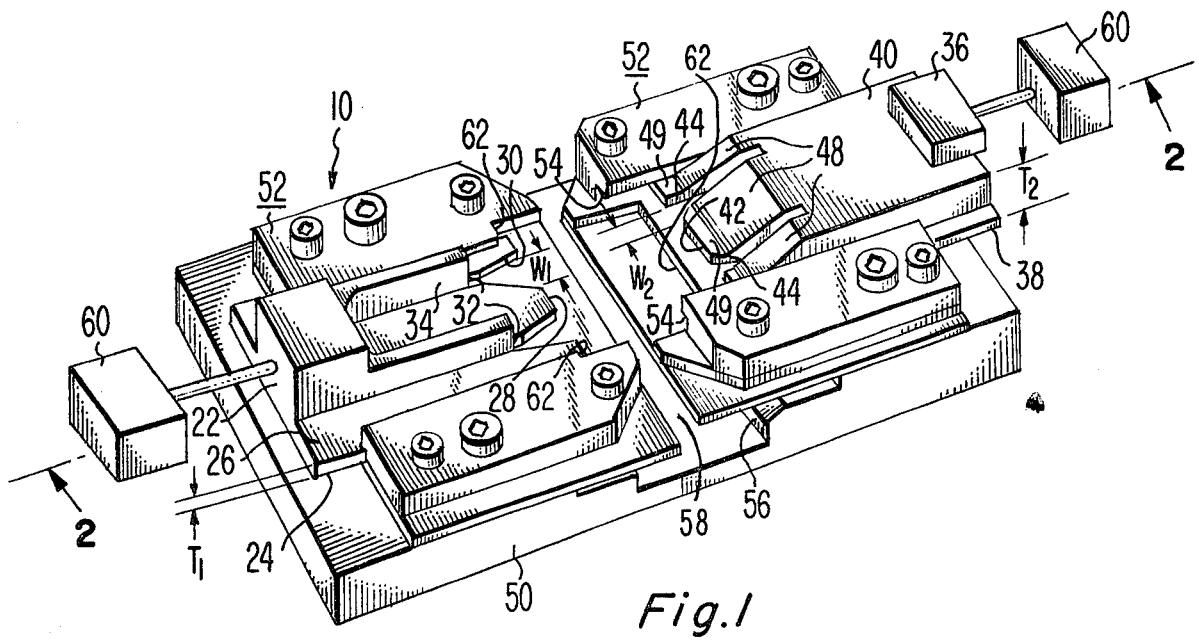
FIG. 1 is a perspective view of a machine, not drawn to scale, embodying the principles of the present invention.
Figure 2:
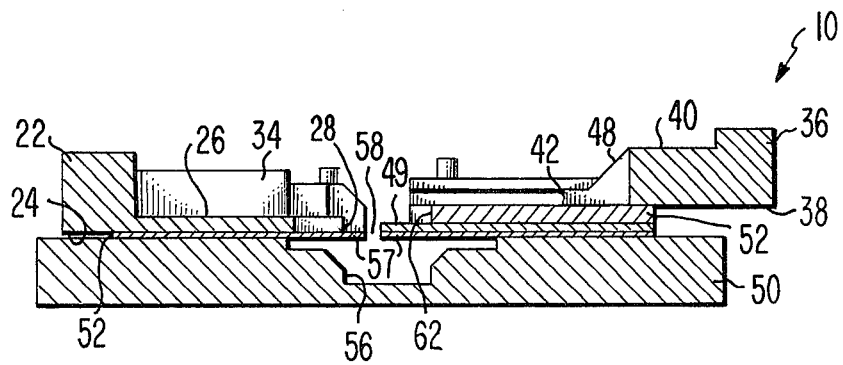
FIG. 2 is a cross-sectional view of the machine shown in FIG. 1 taken along the line A—A thereof.

A machine, indicated generally at 10 in FIGS. 1 and 2, which employs the principles of the present invention can be used in the manufacture of semiconductor devices, such as power transistors, for example. The machine 10 can be designed to accommodate semiconductor devices having various shapes, e.g., oblong, elliptical or round. However, the machine 10 is particularly adaptable to power transistors which have the general shape of an oblique equilateral parallelogram. One such typical transistor is indicated generally at 12 in FIG. 3.

Figure 3:
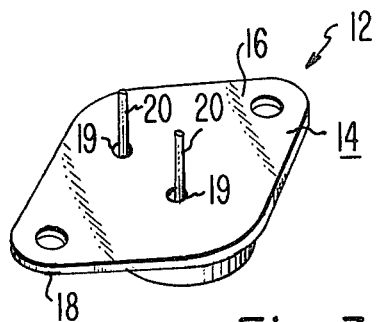
FIG. 3 is a perspective view of a typical semiconductor device, not drawn to scale, upon which the machine shown in FIG. 1 may be used.

The transistor 12 shown in FIG. 3 comprises a header 14 having the general shape of an oblique equilateral parallelogram. The header 14 has first and second major opposing surfaces, 16 and 18 respectively. A plurality of leads 20 extend substantially perpendicularly away from the first surface 16. Preferably, the leads 20 lie in a plane which is substantially parallel to a line, not shown, drawn between the apexes of the obtuse angles of the oblique parallelogram of the header 14. Further, for reasons known in the art, it is preferred that the plane of the leads 20 be comparatively nearer to the apex of one of the acute angles of the oblique parallelogram than to the apex of the other acute angle. Generally, there is a glass to metal seal 19 between each lead 20 and the header 14 where the lead 20 passes therethrough.

The machine 10 comprises a first jaw 22 having a bottom surface 24 and a top surface 26 which is spaced apart from the bottom surface 24 by a thickness $T_1$. The thickness $T_1$ sould be relatively small, for example about 0.2 cm, compared to the length of the leads 20 extending beyond the header 14, usually about 1.27 cm. Preferably, the bottom surface 24 is substantially parallel to the top surface 26. The first jaw 22 has a leading edge 28 which has a plurality of V-shaped grooves 30 therein. The number of grooves 30 is preferably equal to the number of leads 20 to be simultaneously straightened. The V-grooves 30 have a width $W_1$, more fully discussed below, at the leading edge 28. It is possible, of course, that the device would have only one lead to be straightened but most devices will have a plurality of leads. At about the apex of each of the V-grooves 30 a lead slot 32 extends into the first jaw 22 away from the leading edge 28. The relative length of the lead slot 32 is more fully discussed below.

A lead brace 34 extends substantially perpendicularly upward from the top surface 26 at about the end of each lead slot 32. Preferably, the lead braces 34 extend to a height which is about equal to that of the portions of the leads 20 which, during the operation of the machine, extend beyond the top surface 26. The lead braces 34 should have a width which is about equal to that of the diameter of the leads 20 to be straightened. The face of each lead brace 34 nearest the lead slot 32 is preferably concave to more readily accept a lead 20 during the operation of the machine 10.

A second jaw 36 comprises a bottom surface 38 and a top surface 40 which is spaced apart from, by a thickness $T_2$, and substantially parallel with the bottom surface 38. The second jaw 36 also has a leading edge 42 with a plurality of V-shaped grooves 44 therein. For reasons explained below, the V-grooves 44 of the second jaw 36 have a width $W_2$ at the leading edge 42 thereof which is less than the width $W_1$ of the V-grooves 30 at the leading edge 28 of the first jaw 22. At the apex of each V-groove 44 of the second jaw 36 there is a lead slot 46 extending away from the leading edge 42. Preferably, the edges of the lead slots 46 are rounded to prevent the scoring of the leads 20 during the operation of the machine 10. The second jaw 36 has a beveled surface 48 extending at an acute angle from an intermediate surface 49 to the top surface 40. The intermediate surface 49 is spaced apart from the bottom surface 38 by a thickness which is preferably about equal to $T_1$. The intermediate surface 49 extends from the leading edge 42 to about the apex of the V-grooves 44 and is substantially parallel with the bottom surface 38. Preferably, the beveled surface 48 intersects the intermediate surface 49 at about the apex of the V-grooves 44.

The first and second jaws, 22 and 36 respectively, are slidably affixed to a base 50, for example, by means of a pair of guide assemblies 52 which have guide slots 54 for the jaws, 22 and 36. The guide slots 54, as shown in FIG. 1, insure that the movement of the jaws, 22 and 36, is only in a single geometric plane, i.e., there is no rotational movement of the jaws, 22 and 36. The jaws, 22 and 36, are affixed so that the leading edges, 28 and 42, thereof, are opposing each other. The jaws, 22 and 36, are arranged so that the first jaw 22 can extend beneath the second jaw 36 when the jaws 22 and 36 are closed on the leads 20. That is, when closed, the bottom surface 38 of the second jaw 36 overlies a portion of the top surface 26 of the first jaw 22.

In the preferred embodiment, the base 50 has means 56 for receiving devices 12 oriented such that leads 20 extend in a direction such that they are engaged by the V-shaped grooves 30 and 44 of jaws 22 and 36 when the jaws are meshed. Preferably, the means 56 is a cavity having a profile similar to that of the device 12. The cavity should be sufficiently large so that the device 12 can slide freely therein. In addition, it is preferred that a pair of relatively thin plates 57 extend over the cavity to form a slot 58 through which the leads 20 extend when the device 12 is placed in the cavity.

The machine 10 further comprises means 60 for moving the jaws 22 and 36 laterally toward each other in the guide assemblies 52. The means 60 can be manual or mechanical, such as a compressed air or hydraulic system. To prevent the overextension of either jaw, 22 or 36, stopping means 62 should be included on the machine 10. For example, a recess 62 can be incorporated into one of the guide assemblies 52 so that, for example, the leading edge 28 of the first jaw 22, can not extend beyond a given point. The stopping means 62 is designed so that when the jaws 22 and 36 are fully closed, or meshed, a substantially circular gap about equal to the diameter of the leads 20 remains between the lead braces 34 of the first jaw 22 and the end of the lead slot 46 of the second jaw 36. Hence, the length of the lead slots 32 and the depth of the V-grooves 30 of the first jaw 22 are designed to be about equal to the distance between the center of the slot 58 and the recess 62 opposite the leading edge 28.

The operation of the machine 10 is discussed below through the use of two specific examples. The first example pertains to lead bends which are solely in a direction transverse to the direction of the movement of the jaws 22 and 36, while the second example deals with bends which are solely perpendicular to the direction of movement. Since any other bend can be resolved into a transverse component and a perpendicular component these two examples demonstrate that substantially any bend is straightened by the machine 10.

In the first case, the device 12 is inserted into the cavity 56 and substantially aligned with the V-grooves 30 and 44 after which the means 60 for moving the jaws, 22 and 36, is activated and the jaws, 22 and 36, converge and mesh with each other. If, for example, the direction of the bend is toward the first jaw 22 the lead 20 initially contacts the lead brace 34 of the first jaw 22. Then, by mere pressure alone, the jaws 22 and 36 hammer the lead 20 into an upright position. During the straightening process the thin plates 57 act as a fulcrum about which the leads 20 are upwardly rotated. The slot 58 also aligns the leads 20 when there is a plurality of leads. The plates 57 prevent the bending forces from acting on and fracturing the glass to metal seals 19. When the jaws are closed the lead braces 34 of the first jaw 22 extend into the lead slots 46 of the second jaw 36. This type of bend only needs to be manually pre-straightened, as in the prior art, if the bend is so severe that the lead braces 34 cannot force the lead 20 vertically away from the header 14. Fortunately, severe bends of this type are comparatively rare and in most instances, manual pre-straightening is not necessary.

In the second case, where the leads 20 are bent perpendicular to the direction of jaw movement, it is preferred that the means 60 for moving the jaws 22 and 36, be adjusted so that the first jaw 22 contacts the leads 20 prior to the second jaw 36. Upon contacting the lead 20, the first jaw 22, due to its wider V-groove 30 at the leading edge 28 and due to its relatively small thickness $T_1$, begins to straighten the lead 20.

The convergence of the second jaw 36 on the lead 20 should be at a point when the leading edge 28 of the first jaw 22 has extended under the lead 20 to a position where the width of the V-grooves 30 at the point of lead contact is equal to or less than the width of the V-groove 44 at the leading edge 42, $W_2$, of the second jaw 36. At this point, control of the straightening forces on the lead 20 is substantially completely transferred from the first jaw 22 to the second jaw 36 and the first jaw 22 acts as a fulcrum for the leads 20 against the forces exerted by the second jaw 36. The second jaw 36 continues to lift the lead 20, via the force exerted by the intermediate surface 49 until the lead 20 reaches the apex of the V-grooves 44 of the second jaw 36. Then, primarily by way of the forces exerted by the beveled surface 48, the lead 20 is guided into the lead slot 46 of the second jaw 36 and hammered into place between the second jaw 36 and the lead braces 34 of the first jaw 22.

By being relatively thin and by being the first to engage the leads 20 of a device 12, the first jaw 22, acts as a fulcrum around which the leads 20 are straightened and thus protects the glass to metal seals 19 of the device 12 from the straightening forces of the second jaw 36. That is, once the first jaw 22 has contacted the lead 20 and slid thereunder, the second jaw 36 is substantially completely prevented from exerting direct bending forces on the glass to metal seal 19 at the header 14. In addition to protecting the glass to metal seal 19, the machine 10 substantially completely eliminates the need for any manual pre-straightening of the leads 20. Further, the machine 10 herein described can be readily introduced into an automated system wherein devices 12 are delivered, via a guide rail mechanism (not shown) for example, into the cavity 56 of the machine 10, straightened, and then forced out of the cavity 56 by the following device 12.

We claim:

1. A machine for straightening at least one wire lead of a device wherein the leads extend in the same general direction when there is a plurality of leads comprising:
    a first jaw slidably affixed to a base, said first jaw having a leading edge which has at least one V-shaped groove therein, said first jaw being relatively thin with respect to the length of said lead;
    a second jaw slidably affixed to said base in an opposing relation to said first jaw, said first and second jaws being affixed to said base in such a fashion that the movement thereof is only in a single geometric plane, said second jaw having a leading edge which is proximate said leading edge of said first jaw, said leading edge of said second jaw having at least one V-shaped groove therein each substantially aligned with a corresponding one of said V-shaped grooves of said first jaw, said second jaw being affixed to said base such that said first jaw can slide thereunder, and
    means for moving said jaws toward each other such that said jaws mesh with each other to contact and straighten said lead or leads.

2. A machine as claimed in claim 1 wherein:
    said means is adjusted such that said first jaw contacts said lead or leads prior to said second jaw.

3. A machine as claimed in claim 1 wherein said base further comprises:
    means for receiving said devices oriented such that said lead or leads extend in a direction to be engaged be said V-shaped grooves when said jaws are meshed.

4. A machine as claimed in claim 3 wherein:
    said means is a cavity in said base having substantially the same profile as said semiconductor device.

5. A machine as claimed in claim 4 wherein:

said jaws are affixed to said base by a pair of guide assemblies having guide slots for said first and second jaws.

6. A machine as claimed in claim 5 wherein:
said guide assemblies extend over said cavity to form a slot.

7. A machine as claimed in claim 1 said first jaw further comprises:
- a lead slot associated with each V-shaped groove of said first jaw extending away from said leading edge thereof from about the apex of each said V-shaped groove,
- a lead brace associated with each said lead slot extending substantially perpendicularly upward from said first jaw, each said lead brace being about as wide as each said lead, and
- means on said second jaw for hammering each of said leads against a different one of said braces.

8. A machine as claimed in claim 1 wherein said second jaw further comprises:
- a bottom surface, an intermediate surface and a top surface which are substantially parallel with each other and
- a beveled surface extending from about the apex of said V-shaped grooves of said second jaw to said top surface, said beveled surface forming an acute angle with said intermediate surface and rising in a direction away from said leading edge of said second jaw.

9. A machine as claimed in claim 1 wherein:
said V-shaped grooves of said first jaw are comparatively wider at said leading edge thereof than said V-shaped grooves of said second jaw at said leading edge thereof.

10. A machine as claimed in claim 1 further comprising:
means for limiting the length of travel of each of said jaws.

* * * * *

UNITED STATES PATENT AND TRADEMARK OFFICE
CERTIFICATE OF CORRECTION

PATENT NO. : 4,106,532

DATED : August 15, 1978

INVENTOR(S) : Nicholas Francis Gubitose and Robert Arthur James

It is certified that error appears in the above-identified patent and that said Letters Patent is hereby corrected as shown below:

Column 4, line 63: "be" should be --by--.

Signed and Sealed this

Thirteenth Day of February 1979

[SEAL]

Attest:

RUTH C. MASON
Attesting Officer

DONALD W. BANNER
Commissioner of Patents and Trademarks